United States Patent [19]
Orchard-Webb

[11] Patent Number: 5,557,130
[45] Date of Patent: Sep. 17, 1996

[54] ESD INPUT PROTECTION ARRANGEMENT

[75] Inventor: Jonathan H. Orchard-Webb, Kanata, Canada

[73] Assignee: Mitel Corporation, Kanata, Canada

[21] Appl. No.: 385,880

[22] Filed: Feb. 9, 1995

[30] Foreign Application Priority Data

Feb. 11, 1994 [CA] Canada .................................. 2115477

[51] Int. Cl.$^6$ ................................... H01L 23/62
[52] U.S. Cl. .................. 257/359; 257/139; 257/173; 257/355; 257/358; 257/360; 257/378; 257/546; 257/392
[58] Field of Search .................... 257/139, 173, 257/355, 358, 359, 360, 378, 392, 546

[56] References Cited

U.S. PATENT DOCUMENTS 5,270,565  12/1993  Lee et al. .................. 257/360

*Primary Examiner*—Edward Wojciechowicz
*Attorney, Agent, or Firm*—Marks & Clerk

[57] ABSTRACT

An arrangement for protecting an input of a monolithic integrated circuit against ESD events, comprises a thick field bipolar main transistor adapted to breakdown under ESD stress to dissipate ESD energy, a thin field bipolar main transistor adapted to breakdown under ESD stress, and an attenuator resistor. The thin field transistor has a lower breakdown voltage than the thick field transistor whereby for an ESD event of a given polarity, the thin field transistor breaks down before the thick field transistor. During an ESD event current, the thin field device responds rapidly to the fast edge of an ESD transient and thereby shunts current that the thick field device is too slow to respond to.

9 Claims, 5 Drawing Sheets

ESD INPUT PROTECTION ARRANGEMENT

BACKGROUND OF THE INVENTION

This invention relates to an input circuit for protecting an input of an integrated circuit against electrostatic discharge (ESD) events.

Integrated circuits have been traditionally protected against ESD events by diodes which divert the energy from delicate circuit elements of the integrated circuit and deposited on the substrate. The problem with such events, however, is that they are extremely fast, and it is difficult to find protection diodes that respond fast enough and that can switch to a low enough resistance state to prevent circuit failure under ESD stress.

Many different protection systems are currently employed, but one known technique makes use of a thick field transistor, resistor, diode network and is described by Harris in the EOS/ESD Symposium Proceedings, page 220, 1987.

In the Harris device, for the case of n-substrates with p-wells, for example, for a positive ESD event at the input pin with respect of $V_{dd}$, the p-well of the thick field transistor is forward biased and thus has a low resistance to the substrate. This means that ESD energy is safely dissipated to $V_{dd}$.

For a negative event, the voltage rises until avalanche breakdown at the lateral collector occurs, at which point minority current flows from the collector to the base under the emitter and thereby forward biases the emitter, snapping on the lateral bipolar transistor formed by the p-well, the collector and emitter. Once turned on, the transistor safely dissipates energy to $V_{dd}$. Such a device is known as a snap-back device.

Thus, while the thick field transistor is extremely robust, there is nonetheless a finite delay in it becoming turned on by the ESD impulse. As a result it cannot respond to a very fast rising edge of an ESD transient, leading to the possibility of damage to the integrated circuit components.

An input protection circuit of interest is disclosed in U.S. Pat. No. 5,237,395. This patent, which is described in relation to p-type substrates, seeks in part to address the problem that there may be a delay in the device turning on due to the need to have a high avalanche breakdown voltage in order to prevent the device from turning on during normal circuit operation. The patent discloses the use of a thin film field effect transistor, which is used in the field effect mode to discharge ESD current. However, this device must be turned on in the field effect sense by its gate, and as a result extra circuitry (the third stage) is required to sense the presence of a rapid ramp-up of the power supply. This additional circuitry makes the device more complex, when space on an integrated circuit die is at a premium. Furthermore, the sensing circuitry and field effect transistor cannot provide the fast response time associated with the thick film snap back device.

SUMMARY OF THE INVENTION

According to the present invention there an input circuit for protecting a monolithic integrated circuit with a substrate of a first conductivity type against ESD events, comprising a snap-back thick field bipolar transistor arrangement adapted to breakdown under ESD stress to dissipate ESD energy appearing at a contact pad, a snap-back thin field bipolar transistor arrangement adapted to breakdown under ESD stress, and an attenuator resistor connecting said thin field transistor arrangement to said contact pad, said thin field transistor having a lower breakdown voltage than said thick field transistor whereby for an ESD event of a given polarity, said thin field transistor breaks down before said thick field transistor, thereby shunting the fast edge of an ESD transient that the thick field device is too slow to respond to.

The thin field transistor breaks down at a lower voltage than the thick film transistor due to the presence of the thin gate oxide. The thin oxide transistor snaps on and shunts the fast rising portion of the ESD event The thin film transistor then draws current through the attenuator resistor causing the voltage to rise on the input pad, whereupon the thick film snaps on. The main portion of the ESD energy is then shunted by the thick oxide transistor, which turns on more slowly but is more robust.

The invention is applicable to both p and n type substrates, in which case the various conductivity types and polarities are determined in a manner known to a person skilled in the art.

The thick and thin film transistors are normally formed in separate wells of a conductivity type opposite to that of the substrate.

In a particularly desirable embodiment the transistors have lateral collectors merged with a scribe ring, which overlapping a base well. This arrangement eliminates the need for a separate lateral collector.

BRIEF DESCRIPTION OF THE DRAWINGS

The invention will now be described in more detail, by way of example only, with reference to the accompanying drawings, in which.

DESCRIPTION OF THE PREFERRED EMBODIMENTS

Figure 3:
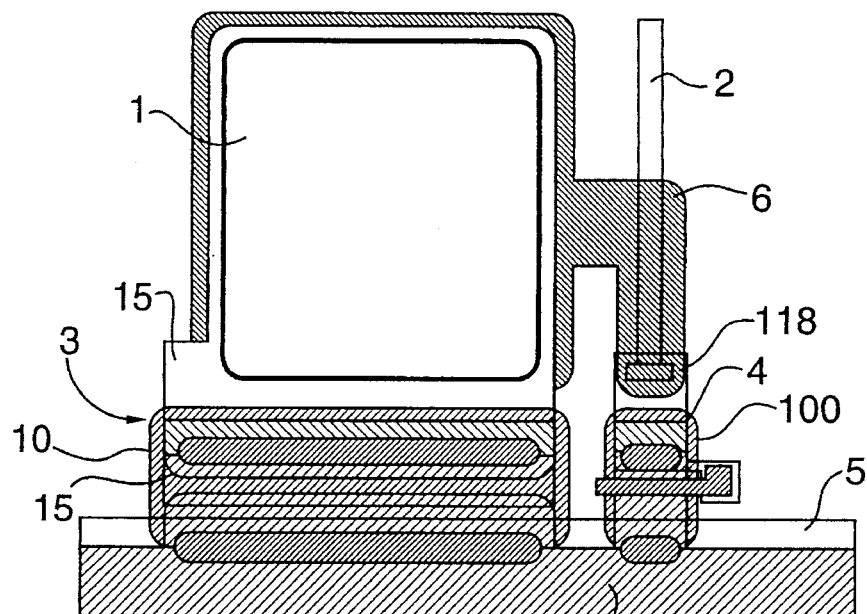
FIG. 3 is a plan view of an input portion of an integrated circuit showing the preferred layout of the protection arrangement in accordance with the invention.

Referring first to FIG. 3, the integrated circuit, which has an n-type substrate, has an input bonding contact pad 1 connected to input 2 of the active circuit components (not shown) of the integrated circuit. The pad 1, which can be an input pad or a $V_{ss}$ pad, is associated with thick field device 3 and thin field device 4, both of which are located in the margin of the die adjacent the scribe ring 14 and formed in separate respective p-wells 10, 100. This arrangement is advantageous in that it saves precious die area.

Thin field device 4 is connected directly to the input circuit 2, whereas pad 1 is connected through polysilicon attenuator resistor 6. Both devices 3 and 4 are snap back devices, which when reverse-biased break down and undergo bipolar transistor action.

Figure 1:
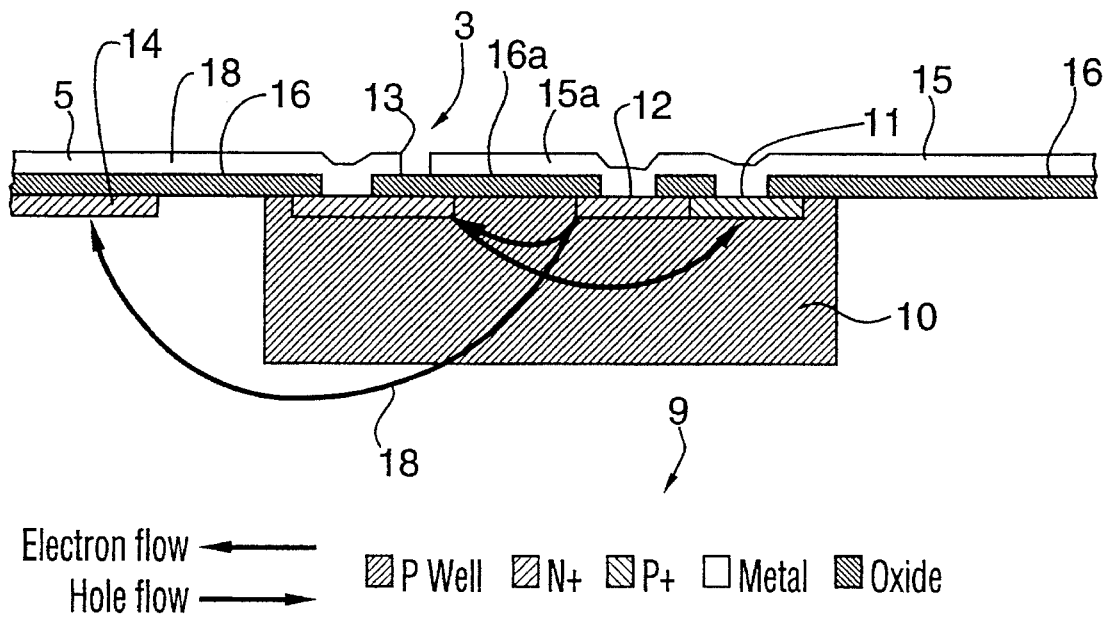
FIG. 1 is a cross-section through a thick field protection diode for n-substrates with a separate lateral collector.

Referring now to FIG. 1, the device shown is of slightly different construction from the device shown in FIG. 3, but nonetheless conforms to the same general layout. The thick field device 3 employs an n-channel field effect transistor structure with a thick oxide 16a over the n channel and a gate 15a tied to the input or contact pad 1. However, since gate 15a is tied to the input, the field effect transistor structure is held off in a field conduction sense.

The device comprises a p-well base 10 formed in n-type substrate 9. Within the p-well base 10 are formed a $p^+$ diffused base contact 11, an $n^+$ diffused emitter 12, and an $n^+$ diffused lateral transistor collector 13. An $n^+$ diffusion forms the $V_{dd}$ scribe ring 14 and acts as a collector for vertical transistor action with emitter 12.

A metal input layer 15 deposited over thick oxide layer 16 is connected to both base contact 11 and emitter 12 and thereby short-circuits the base-emitter junction. The same layer 15 also is also directly connected to attenuator resistor 6 (FIG. 3) formed of a polysilicon diffusion. In a preferred embodiment, this resistor is merged with a bonding pad obviating the need for separate contacts to the resistor. Collector 13 is connected via metal contact layer 18 to $V_{dd}$.

In the case of a positive ESD event on input pad 1, the p-well 10 is forward biased relative to the collector 13 and the ESD energy can be safely dissipated to $V_{dd}$ through lateral collector 13.

However, for a negative event, p-well 10 is reverse biased and energy cannot be immediately dissipated. Eventually the reverse voltage exceeds the breakdown voltage of the reverse-biased collector-base junction and avalanche breakdown occurs at the edge 13a of the lateral collector 13. A hole current 17 then flows under emitter 12 to base 11 and in doing so forward biases the emitter 12. As a result, bipolar transistor action occurs between the emitter 12 and lateral and vertical collectors 13 and 14 respectively. The resulting electron current rapidly discharges the ESD energy. However, with a thick film snap-back device of nature, avalanche breakdown does not occur fast enough to discharge fast-rising edges of ESD transients, allowing such transients to damage the delicate circuit components in the integrated circuit.

Figure 2:
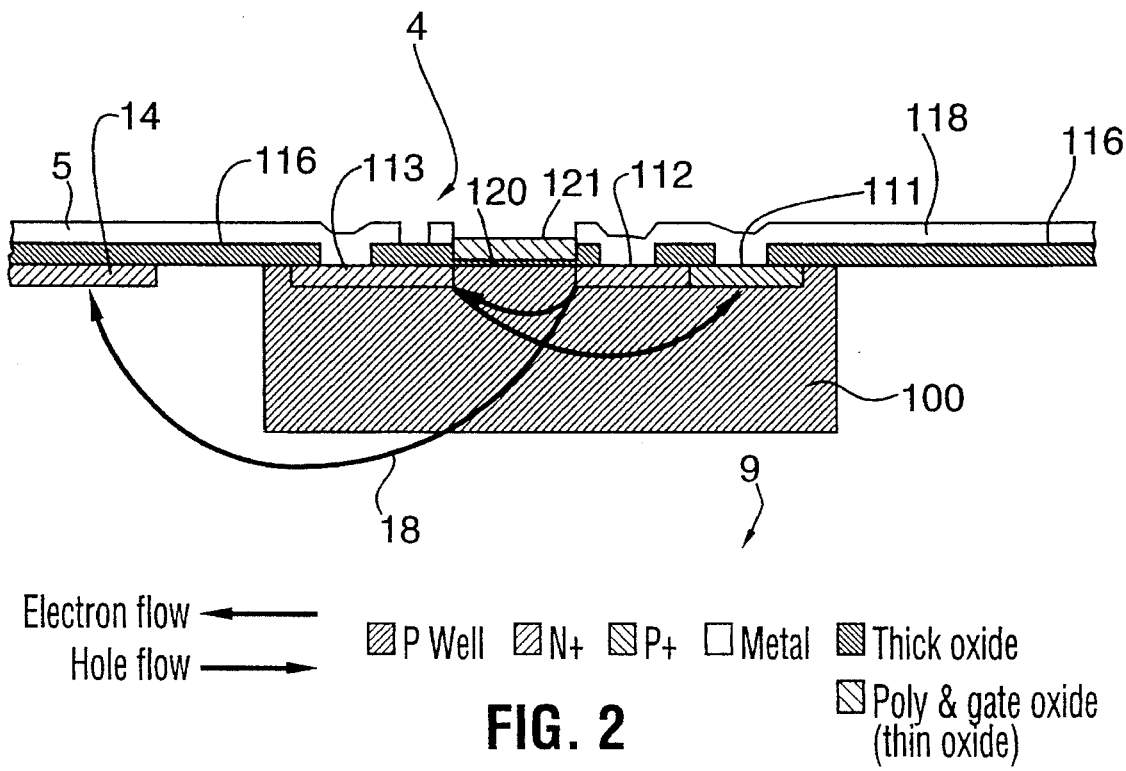
FIG. 2 is a cross-section through a thin field protection diode for n-substrates with a separate lateral collector.

In accordance with the invention, the input pad 1 is also connected through attenuator resistor 6 and metal layer 118 to the separate thin field device 4, shown in FIG. 2, which has its own p-well 110, diffused base contact 111, diffused emitter 112, lateral collector 113, and oxide layer 116. In the gate region, the device has a thin oxide layer 120 overlaid by a polysilicon layer 121 forming thereby thin field device 4 in the p-well 100 in the n-type substrate 109. $N^+$ $V_{dd}$ scribe ring 14 forms a collector for the vertical transistor associated with the device.

The polysilicon layer 121 is in contact with metal layer 118. This is in contrast to the thick field device shown in FIG. 1, which includes a thick field oxide layer 16a.

The thin film device works in a manner similar to the device shown in FIG. 1. When a negative ESD event occurs at the input pad 1, the base collector junction formed by p-well 100 and lateral collector 113 is reverse-biased, but the voltage quickly rises to the breakdown voltage of the thin field transistor collector 113. This considerably less than the breakdown voltage of the collector 13 in the thick field device due to the higher electric filed created by the thin field gate. The resulting hole current 17 flows through p-well base 100 underneath the emitter diffusion 112 through the base contact 111 to metal contact 118, and in doing so forward biases the emitter 112, thereby turning on the lateral and vertical transistors formed respectively with the lateral collector 113 and scribe ring 14, which acts as the collector for the vertical transistor. This has the effect of causing both the vertical and lateral transistors to snap into a low resistance state, drawing current through attenuator resistor 6 and thereby removing the fast edge of the ESD transient that the thick field device 3 is too slow to respond to. The resulting electron flow is shown by arrows 18 in FIG. 2.

Meanwhile, the thick field device 3 functions in a similar manner, albeit more slowly, and thus turns on so that it can conduct the main part of the energy to the substrate.

A particularly useful embodiment is to reduce to the length of both devices by overlapping the p-well base with the $n^+$ scribe ring, thereby removing the need for a separate lateral collector. (This embodiment is shown in FIG. 3).

Many variations, for example as shown in FIGS. 4 to 11, are possible to modify the performance of the thick and thin field diodes without departing from the basic turn-on mechanism, which depends on the shorted emitter-base bipolar transistor action for both thick and thin field devices. The stability and on resistance of either device may be modified by changing the length of the emitter in the direction of current flow. Examples of such embodiments are shown in FIGS. 4 to 11.

Figure 4:
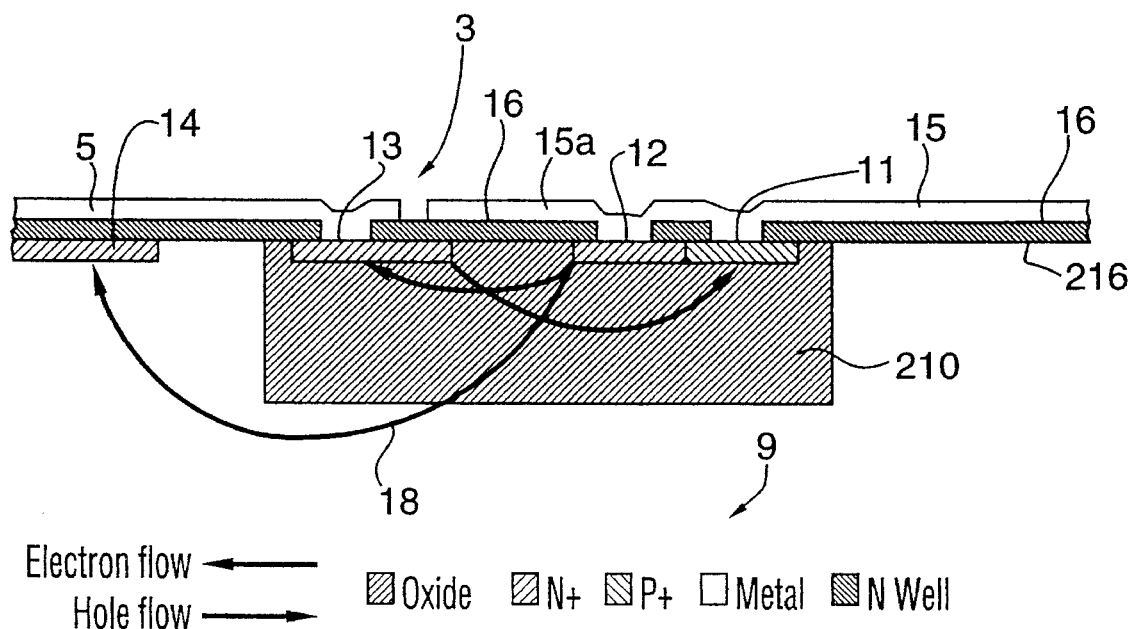
FIG. 4 is a cross section of a thick field device for p-substrates with an n-well.

For example, in FIG. 4, p-type substrate 9 has an n-type well 10 with $p^+$ emitter 12 and $n^+$ base contact 11. Since the embodiment shown in FIG. 4 has a p-type substrate, $V_{ss}$ rail is connected to $p^+$ scribe ring 14. This device otherwise operates in a manner similar to the device shown in FIG. 1 except that the electron and hole flows are reversed due to the use of semiconductors of the opposite conductivity type.

Figure 5:
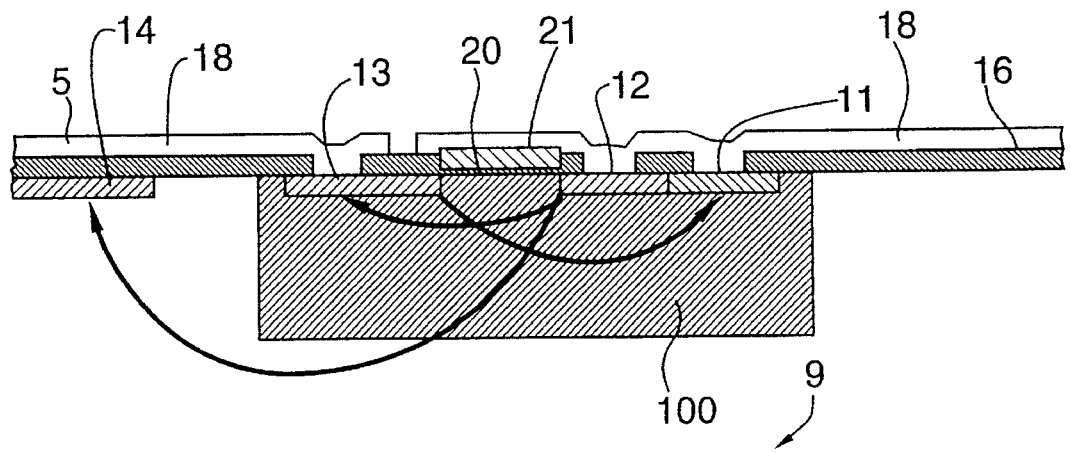
FIG. 5 is a cross section of a thin field device for n-substrates with an n-well.

The device shown in FIG. 5 is similar to the device shown in FIG. 2, but of the opposite conductivity type. This device has a p-type substrate 9, and n-well 10, an $n^+$ base contact 11, a diffused emitter 12, a thin oxide layer 20, a polysilicon layer 21, a $p^+$ lateral collector 13, a $V_{ss}$ contact 5 and a $p^+$ scribe ring 14. This device operates in a similar manner to the device shown in FIG. 2 except that the electron and hole currents are reversed.

Figure 6:
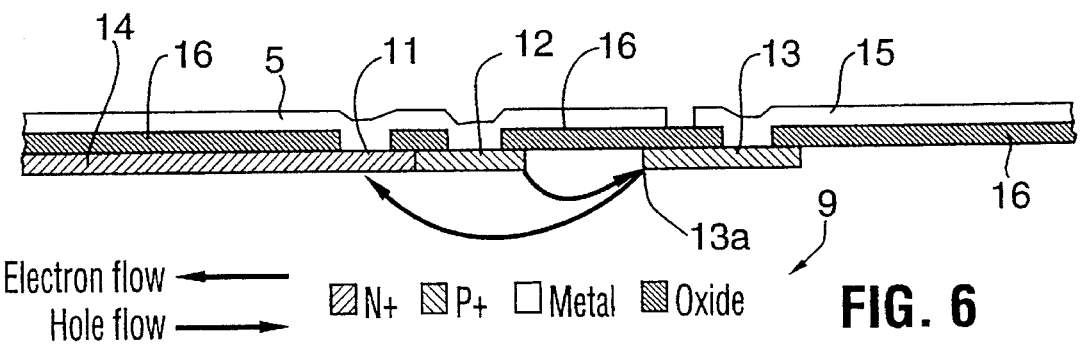
FIG. 6 is a cross section of a thick field device for n-substrates without a p-well.

FIG. 6 shows a thick field device for an n-substrate 9 without a p-well. $N^+$ $V_{dd}$ scribe ring 14 also serve as $N^+$ base contact 11, which lies adjacent $p^+$ emitter 12. The device has thick oxide layer 16, metal contacts 15, and $P^+$ lateral collector 13. The device works in a similar manner to the device described in FIG. 1 except that the n-type substrate serves as the well. For a positive ESD event lateral collector 13 is forward biased and ESD energy can be safely discharged. For a negative event, avalanche breakdown occurs at the edge 13a of the lateral collector 13, causing hole flow to the collector 13, which in turn turns on the lateral bipolar transistor formed by emitter 11 and lateral collector 13.

Figure 7:
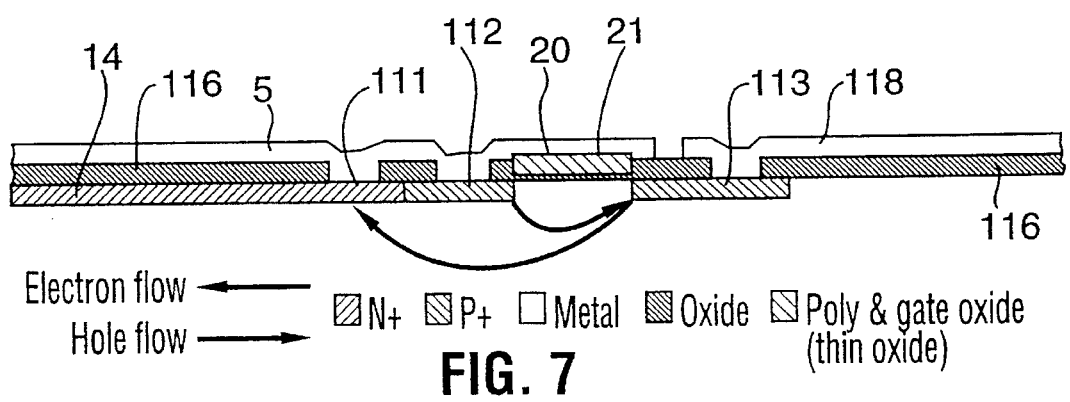
FIG. 7 is a cross section of a thin field device for n-substrates without a p-well.

FIG. 7 shows a thin field device for an n-substrate 400 without a p-well. The device is similar to the device described with reference to FIG. 2 except that, as is the case for the FIG. 5 embodiment, the conductivity types of the emitter and lateral collector have been necessarily reversed due the absence of the p-well.

Figure 8:
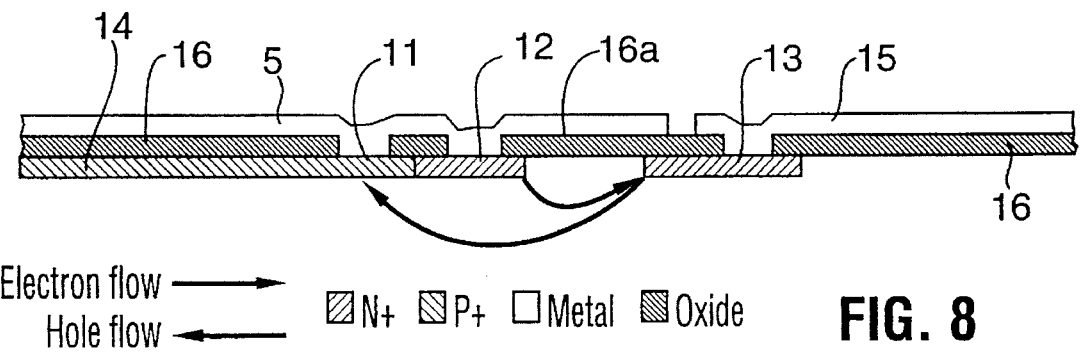
FIG. 8 is a cross section of a thick field device for p-substrates without an n-well.
Figure 9:
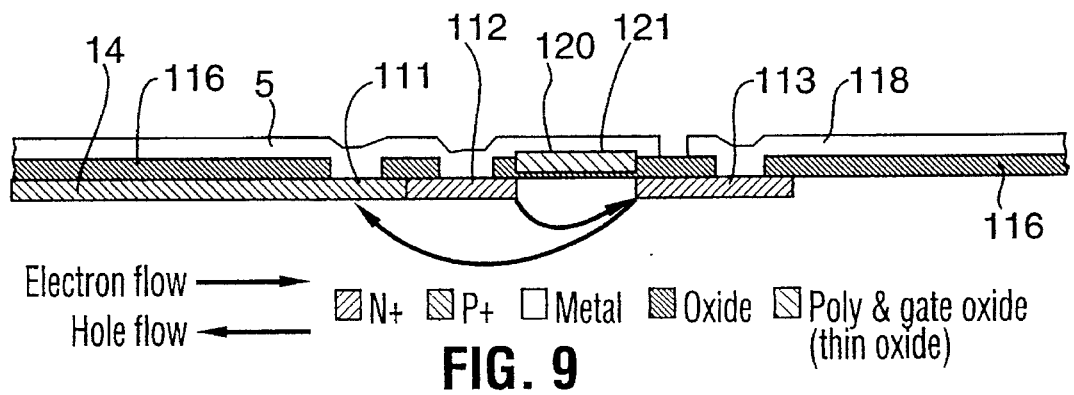
FIG. 9 is a cross section of a thin field device for p-substrates without an n-well.

FIG. 8 and 9 are similar to FIGS. 6 and 7, but are for p-type substrates.

Figure 10:
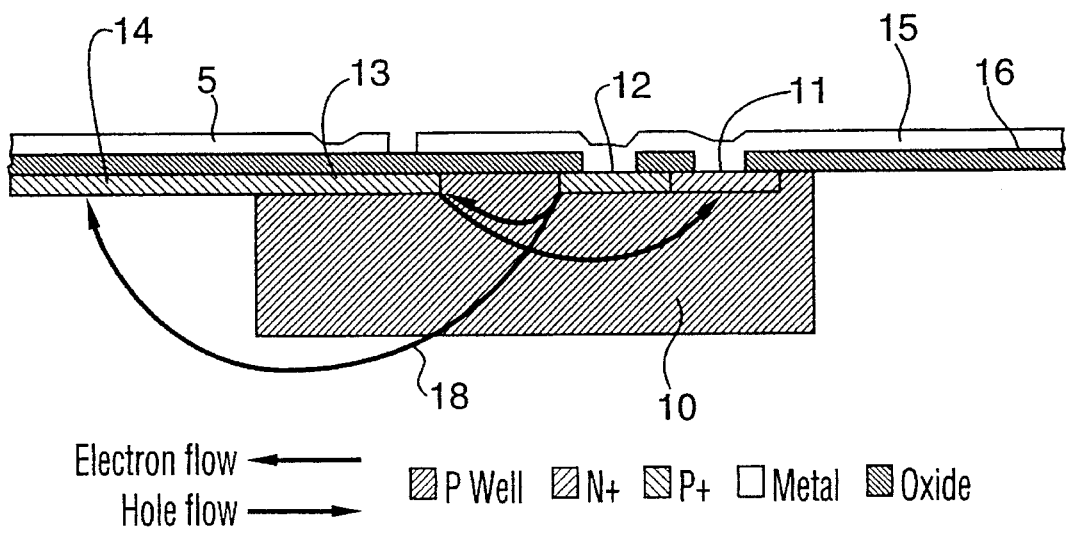
FIG. 10 is a cross section of a thick field device for n-substrates with a p-well and a merged lateral collector.

FIG. 10 shows a thick field device for n-type substrates with a p-well 10 and a lateral collector merged with scribe ring 14. In the device shown in FIG. 10, snap back action occurs after avalanche breakdown occurs at collector edge 13a. Hole current 17 flows under emitter 12, thereby forward biasing it and as a result turning on the lateral and vertical bipolar transistors formed respectively between emitter 12 and lateral collector 13 and scribe ring 14.

Figure 11:
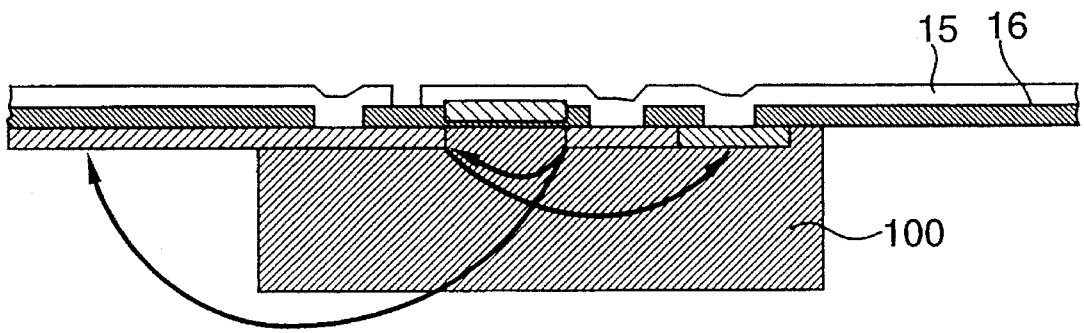
FIG. 11 is a cross section of a thin field device for n-substrates with a p-well and merged lateral collector.

FIG. 11 shows a thin field device with a merged lateral collector similar to FIG. 10.

Figure 12:
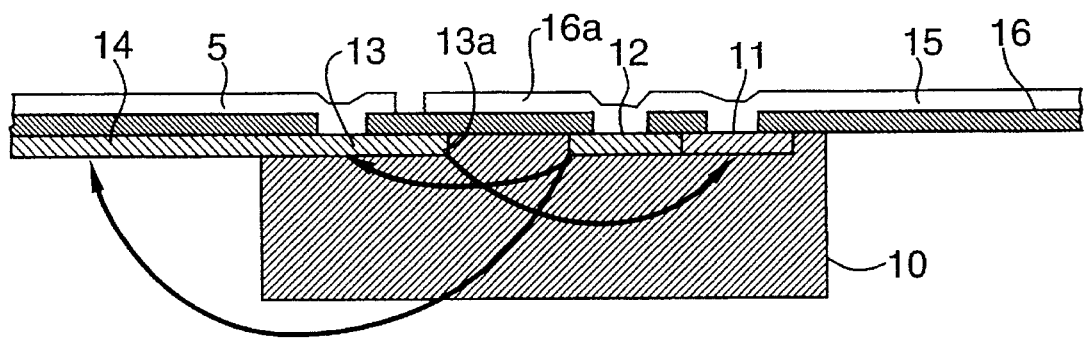
FIG. 12 is a thick field device for n-substrates with an n-well and merged collectors.
Figure 13:
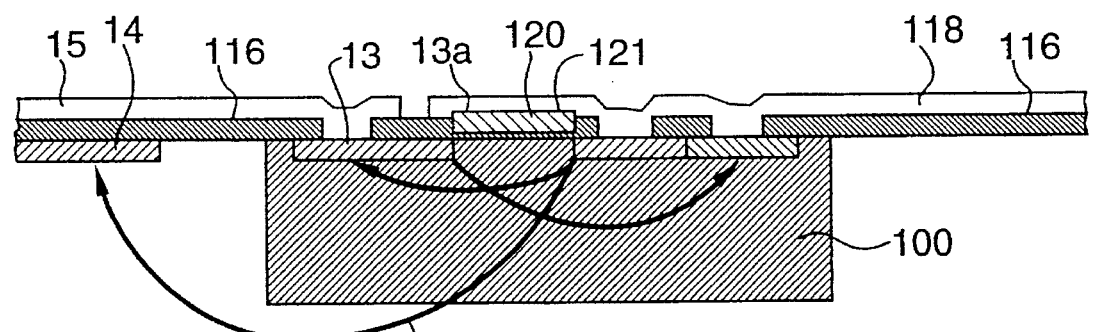
FIG. 13 is a thin field device for n-substrates with an n-well and merged collectors.

FIGS. 12 and 13 show similar devices to FIGS. 10 and 11, but for n-wells in p-type substrates. The mode of operation is similar except that the conductivities and electron and hole flows are reversed.

The merged collector construction is a particularly advantageous construction because it removes the need for a separate lateral collector.

The thick and thin field devices can be made in accordance with standard technology known to persons skilled in the art. However, it is convenient to use the gate oxide for the thin field device dielectric. The terms thick and thin field are well known terms whose meaning is clear to a person skilled in the semiconductor art. Typically the thickness of a thin layer will be in the order of 300 Ångstroms and of a thick layer in the order of 1 micron. The above features have been implemented and proven to work on 0.8µ VLSI circuits, although other circuit dimensions can be employed.

The input structure according to the invention is also small enough to be placed behind a bonding pad in the scribe margin, between the pad and the edge of the die. This saves valuable die area and reduces latch-up because all active diffusions are remote from the circuit.

I claim:

1. An input circuit for protecting a monolithic integrated circuit with a substrate of a first conductivity type against ESD events, comprising a snap-back thick field bipolar transistor arrangement adapted to breakdown under ESD stress to dissipate ESD energy appearing at a contact pad, a snap-back thin field bipolar transistor arrangement adapted to breakdown under ESD stress, and an attenuator resistor connecting said thin field transistor arrangement to said contact pad, said thin field transistor arrangement having a lower breakdown voltage than said thick field transistor arrangement whereby for an ESD event of a given polarity, said thin field transistor arrangement breaks down before said thick field transistor arrangement, thereby shunting the fast edge of an ESD transient that the thick field transistor arrangement is too slow to respond to.

2. An input circuit as claimed in claim 1, wherein said attenuator resistor is integral with said contact pad, thereby eliminating the need for a separate contact to said contact pad.

3. An input circuit as claimed in claim 2, wherein said attenuator resistor comprises polysilicon.

4. An input circuit as claimed in claim 1, wherein each said bipolar transistor arrangement comprises vertical and lateral transistors that are turned on by minority current flow after breakdown of the lateral transistor thereof.

5. An input circuit as claimed in claim 1, further comprising an extended scribe ring merging with a collector for said vertical and lateral transistors.

6. An input circuit as claimed in claim 1, wherein said bipolar transistor arrangements are located in a scribe margin of said integrated circuit to save space and reduce latch-up.

7. An input circuit as claimed in claim 1, wherein said integrated circuit has a substrate of a first conductivity type, and each said transistor is formed in a separate well of a second conductivity type.

8. An input circuit as claimed in claim 1, wherein the active regions of said transistors are formed directly in the substrate.

9. An input circuit as claimed in claim 1, wherein the thin film transistor comprises a gate region consisting of a polysilicon layer overlying a thin film of oxide, said polysilicon layer being in contact with a metal layer connected to said attenuator resistor.

* * * * *